(12) United States Patent
Goto

(10) Patent No.: US 11,495,722 B2
(45) Date of Patent: Nov. 8, 2022

(54) THERMOELECTRIC GENERATION DEVICE

(71) Applicant: KELK Ltd., Kanagawa (JP)

(72) Inventor: Daisuke Goto, Kanagawa (JP)

(73) Assignee: KELK Ltd., Kanagawa (JP)

(*) Notice: Subject to any disclaimer, the term of this patent is extended or adjusted under 35 U.S.C. 154(b) by 226 days.

(21) Appl. No.: 16/634,342

(22) PCT Filed: Jul. 19, 2018

(86) PCT No.: PCT/JP2018/027198
§ 371 (c)(1),
(2) Date: Jan. 27, 2020

(87) PCT Pub. No.: WO2019/026639
PCT Pub. Date: Feb. 7, 2019

(65) Prior Publication Data
US 2021/0367128 A1    Nov. 25, 2021

(30) Foreign Application Priority Data
Aug. 1, 2017   (JP) .............................. JP2017-149296

(51) Int. Cl.
*H01L 35/32*     (2006.01)
*H01L 35/30*     (2006.01)

(52) U.S. Cl.
CPC .............. *H01L 35/32* (2013.01); *H01L 35/30* (2013.01)

(58) Field of Classification Search
CPC ................................. H01L 35/30; H01L 35/32
See application file for complete search history.

(56) References Cited

U.S. PATENT DOCUMENTS 2,520,679 A * 8/1950 Findley ................... H01L 35/00
                                                              136/208
4,773,847 A * 9/1988 Shukla ..................... F23D 11/44
                                                              431/46
(Continued)

FOREIGN PATENT DOCUMENTS

JP    H05-051212    7/1993
JP    11-55975      2/1999
(Continued)

OTHER PUBLICATIONS

PCT International Search Report in International Appln. No. PCT/JP2018/027198, dated Sep. 4, 2018, 2 pages.
(Continued)

*Primary Examiner* — Tamir Ayad
(74) *Attorney, Agent, or Firm* — Fish & Richardson P.C.

(57) ABSTRACT

A thermoelectric generator includes a heat-receiving plate having a heat-receiving surface for receiving flame and high-temperature combustion gas, a thermoelectric generation module disposed at a surface of the heat-receiving plate opposite the heat-receiving surface, a cooling plate disposed at a side of the thermoelectric generation module opposite the heat-receiving plate, a cover disposed to cover the heat-receiving surface and including a heat inlet for introducing the flame and the high-temperature combustion gas and a heat outlet for discharging the temperature-reduced combustion gas introduced through the heat inlet, a heat diffuser provided on the heat-receiving surface at a position corresponding to the heat inlet and configured to diffuse the combustion gas introduced through the heat inlet along the heat-receiving surface, and a heat absorber provided on the heat-receiving surface to surround the heat diffuser and configured to absorb the heat of the high-temperature combustion gas diffused by the heat diffuser.

13 Claims, 8 Drawing Sheets

(56) References Cited

U.S. PATENT DOCUMENTS

| | | | |
|---|---|---|---|
| 6,347,521 B1 * | 2/2002 | Kadotani | F25B 21/02 |
| | | | 136/204 |
| 2014/0158178 A1 | 6/2014 | Wong et al. | |
| 2014/0216516 A1 | 8/2014 | Makino et al. | |
| 2014/0356985 A1 | 12/2014 | Ricci et al. | |
| 2015/0243871 A1 * | 8/2015 | Ollier | H01L 35/30 |
| | | | 136/206 |
| 2017/0110298 A1 | 4/2017 | Ricci et al. | |

FOREIGN PATENT DOCUMENTS

| | | |
|---|---|---|
| JP | 2000-005049 | 1/2000 |
| JP | 2002-238739 | 8/2002 |
| JP | 2013042862 | 3/2013 |
| JP | 2013-80883 | 5/2013 |
| JP | 2013-255769 | 12/2013 |
| JP | 2015-008287 | 1/2015 |
| WO | WO 2013-027749 | 2/2013 |

OTHER PUBLICATIONS

PCT International Preliminary Report on Patentability in International Appln. No. PCT/JP2018/027198, dated Feb. 4, 2020, 8 pages.
Korean Office Action in Korean Application No. 2020-7001490, dated Oct. 26, 2020, 9 pages (with English translation).

* cited by examiner

THERMOELECTRIC GENERATION DEVICE

CROSS-REFERENCE TO RELATED APPLICATIONS

This application claims priority to International Application No. PCT/JP2018/027198, filed on Jul. 19, 2018, which claims priority to Japanese Application No. 2017-149296, filed on Aug. 1, 2017, the contents of which are incorporated herein in their entirety.

TECHNICAL FIELD

The present invention relates to a thermoelectric generator.

BACKGROUND ART

A known thermoelectric generator using Seebeck effect includes two metallic plates of different temperatures and a thermoelectric generation module interposed between the two metallic plates (see, for instance, Patent Literature 1).

In the thermoelectric generator disclosed in Patent Literature 1, gas having been used in a heat-treating furnace to be discharged therefrom is combusted as a fuel of a gas burner to heat a metallic heat-receiving plate with a flame of the gas burner, while a cooling plate is cooled with coolant. The thermoelectric generation module generates electric power with Seebeck effect based on a temperature difference between the heat-receiving plate and the cooling plate (i.e. converts the temperature difference into electricity).

Another thermoelectric generator disclosed in Patent Literature 2 includes fins on a heating surface of a heating plate, the fins serving as a heat absorber for absorbing heat of a flame of a boiler in the heating plate.

CITATION LIST

Patent Literature(s)

Patent Literature 1 JP 2013-80883 A
Patent Literature 2 JP 11-55975 A

SUMMARY OF THE INVENTION

Problem(s) to be Solved by the Invention

However, the flame of the device disclosed in Patent Literature 1, which unevenly touches the heat-receiving plate, cannot evenly raise the temperature of the entire heat-receiving plate, inhibiting efficient power generation by the thermoelectric generation module.

The heat absorber in a form of the fins according to the device disclosed in Patent Literature 2 can enhance the heat absorption effect. However, the presence of the fins alone is still insufficient to reliably absorb the heat with the heat-receiving plate due to irregular nature of the flame blowing out of a heat-treating furnace or the like.

An object of the invention is to provide a thermoelectric generator capable of efficiently and evenly absorbing heat irrespective of irregular and uneven nature of a heat source (i.e. flame).

Means for Solving the Problem(s)

A thermoelectric generator according to an aspect of the invention includes: a heat-receiving plate including a heat-receiving surface that receives flame and/or high-temperature combustion gas; a thermoelectric generation module provided at a surface of the heat-receiving plate opposite the heat-receiving surface; a cooling plate disposed at a side of the thermoelectric generation module opposite a side where the heat-receiving plate is disposed; a cover covering the heat-receiving surface, the cover including a heat inlet that introduces the flame and the high-temperature combustion gas and a heat outlet that discharges the combustion gas introduced through the heat inlet and reduced in temperature; a heat diffuser disposed on the heat-receiving surface at a position corresponding to the heat inlet, the heat diffuser diffusing the combustion gas introduced through the heat inlet along the heat-receiving surface; and a heat absorber disposed on the heat-receiving surface to surround the heat diffuser, the heat absorber absorbing a heat of the high-temperature combustion gas diffused by the heat diffuser.

According to the above aspect of the invention, the heat inlet provided in the cover allows the flame and high-temperature combustion gas blowing out of a heat-treating furnace or the like to be efficiently introduced to the heat-receiving plate. The heat outlet provided in the cover allows the combustion gas, which is deprived of heat by the heat-receiving plate and thus is reduced in temperature, to be discharged to an outside through the heat outlet and to introduce new flame and high-temperature combustion gas from the heat inlet toward the heat-receiving plate.

Further, the heat diffuser diffuses hot air introduced through the heat inlet along the heat-receiving surface, so that the heat can be evenly absorbed by the heat-receiving plate. Further, the heat absorber, which is disposed to surround the heat diffuser, can efficiently transfer the thermal energy of the combustion gas diffused by the heat diffuser to the heat-receiving plate.

Accordingly, the heat-receiving plate can be evenly and efficiently heated even when the flame is irregularly and unevenly blown out of the heat-treating furnace or the like.

BRIEF DESCRIPTION OF DRAWING(S)

FIG. 1 schematically shows a structure of a heat-treating furnace incorporating a thermoelectric generator according to a first exemplary embodiment of the invention.

DESCRIPTION OF EMBODIMENT(S)

Exemplary embodiments of the invention will be described below with reference to attached drawings.

1. Heat-Treating Furnace 100 Incorporating Thermoelectric Generator 1

Figure 1:
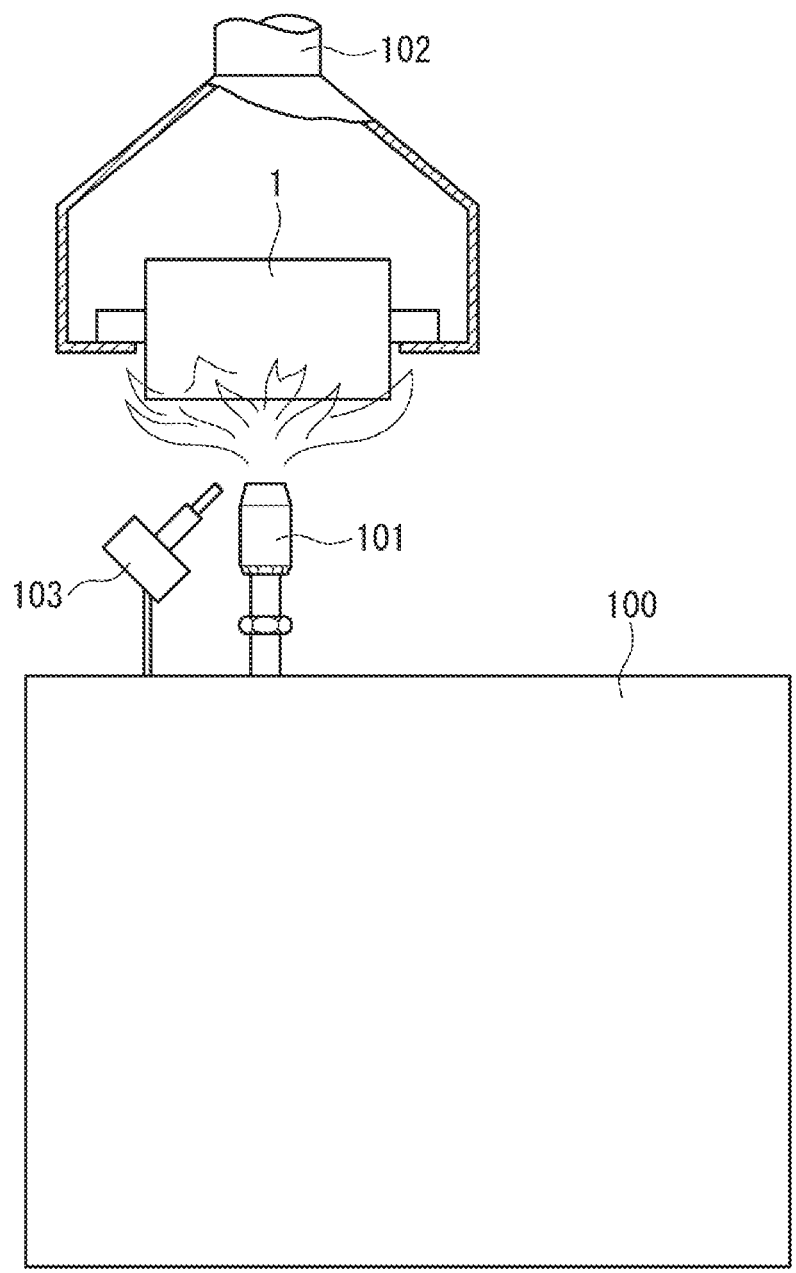

FIG. 1 shows a heat-treating furnace 100 (e.g. gas carburizing furnace) incorporating a thermoelectric generator 1 according to a first exemplary embodiment. Used gas, which is discharged through an exhaust outlet 101 of the heat-treating furnace 100, is ignited and combusted by a pilot burner 103 and is discharged through an exhaust duct 102.

The pilot burner 103 for ignition is provided under the exhaust duct 102. The thermoelectric generator 1 is provided at a position capable of being touched by the flame from the exhaust outlet 101. The thermoelectric generator 1, which is scorched by the flame from the exhaust outlet 101, is configured to convert thermal energy generated by the combusted gas into electricity. It should be noted that it is only necessary for the thermoelectric generator 1 to be provided at a part to be scorched by a high-temperature flame and the thermoelectric generator 1 is not necessarily incorporated in the heat-treating furnace 100.

2. Structure of Thermoelectric Generator 1

Figure 2:
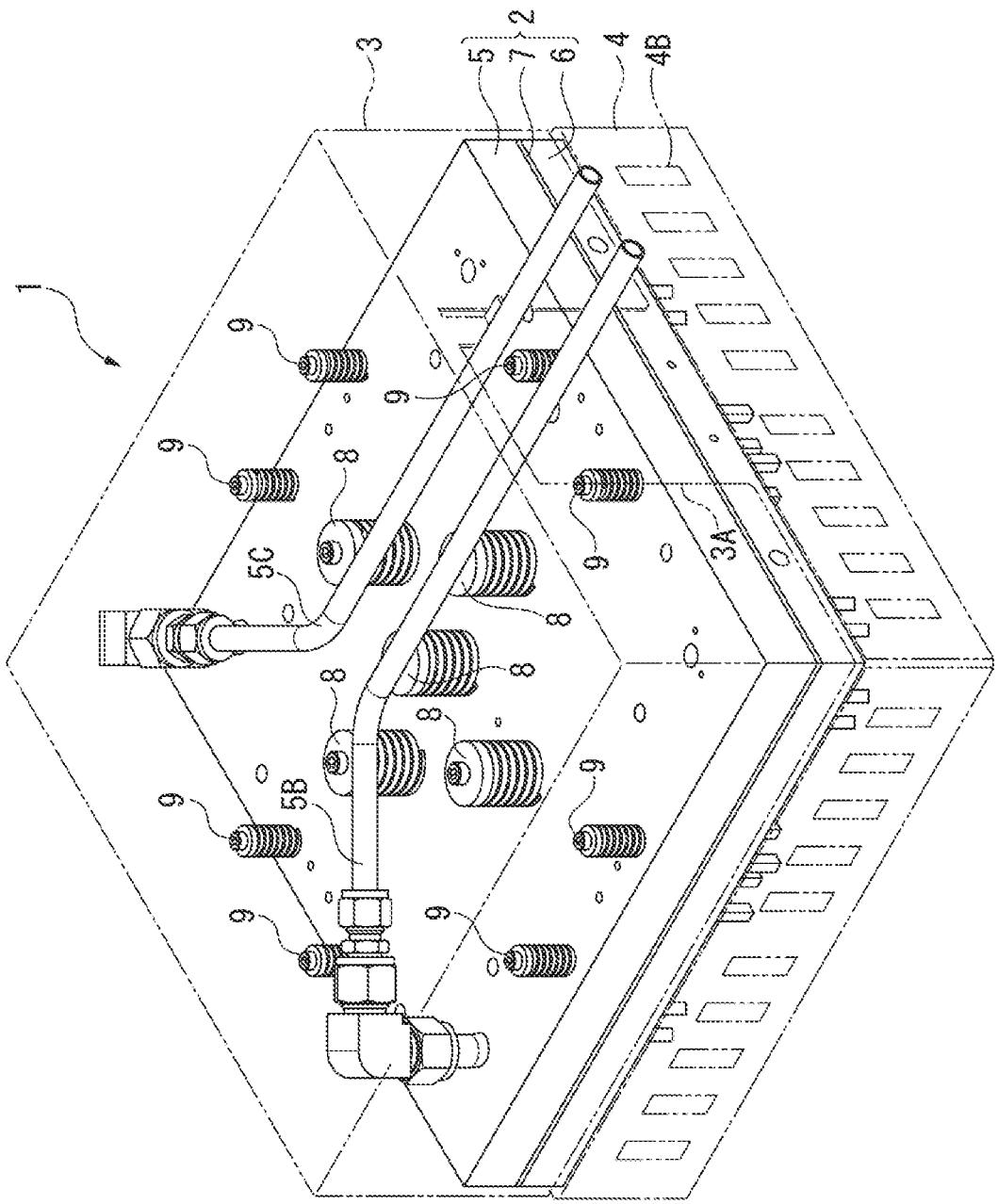
FIG. 2 is a perspective view showing an upper structure of the thermoelectric generator according to the first exemplary embodiment.
Figure 3:
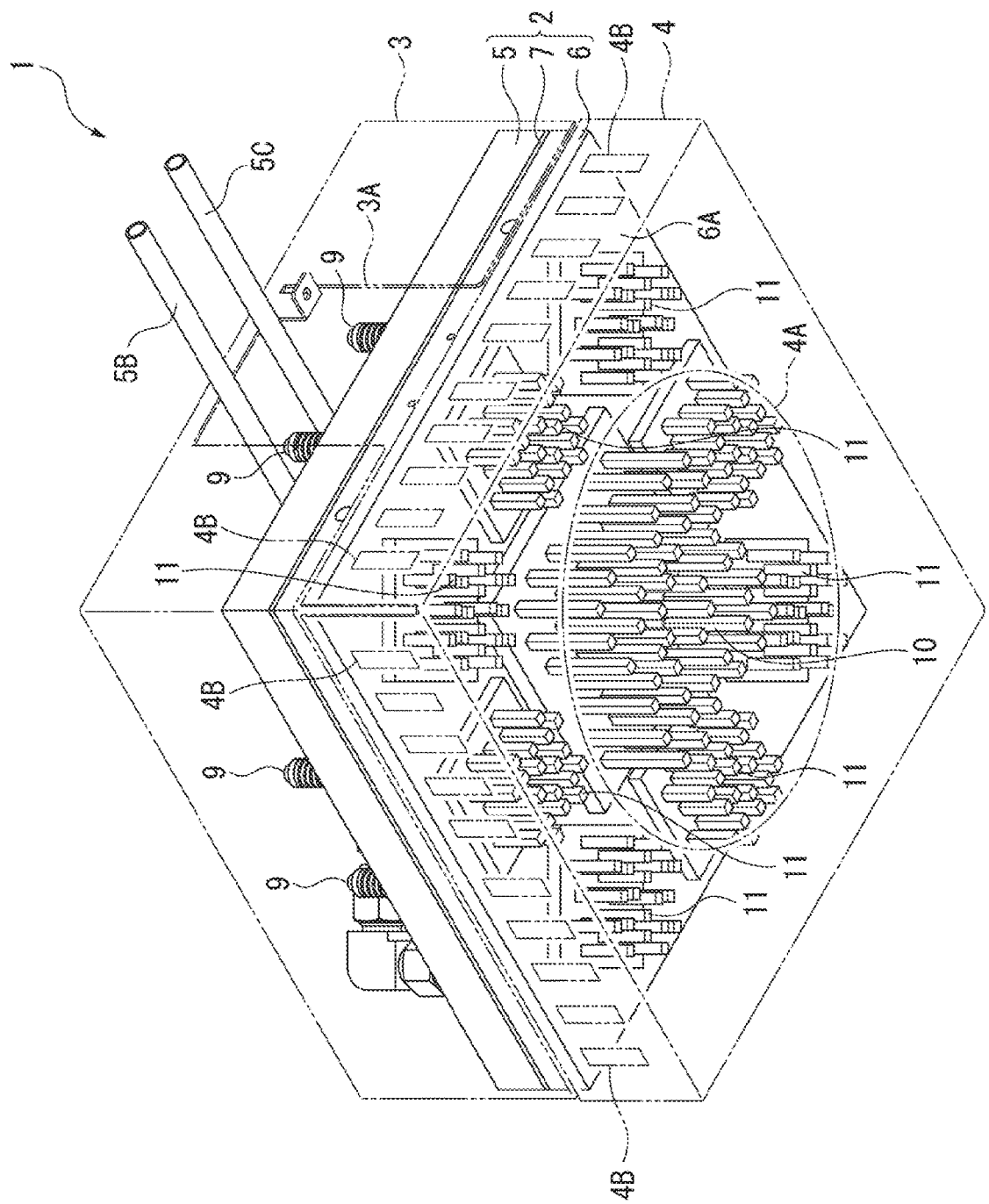
FIG. 3 is a perspective view showing a lower structure of the thermoelectric generator according to the first exemplary embodiment.
Figure 4:
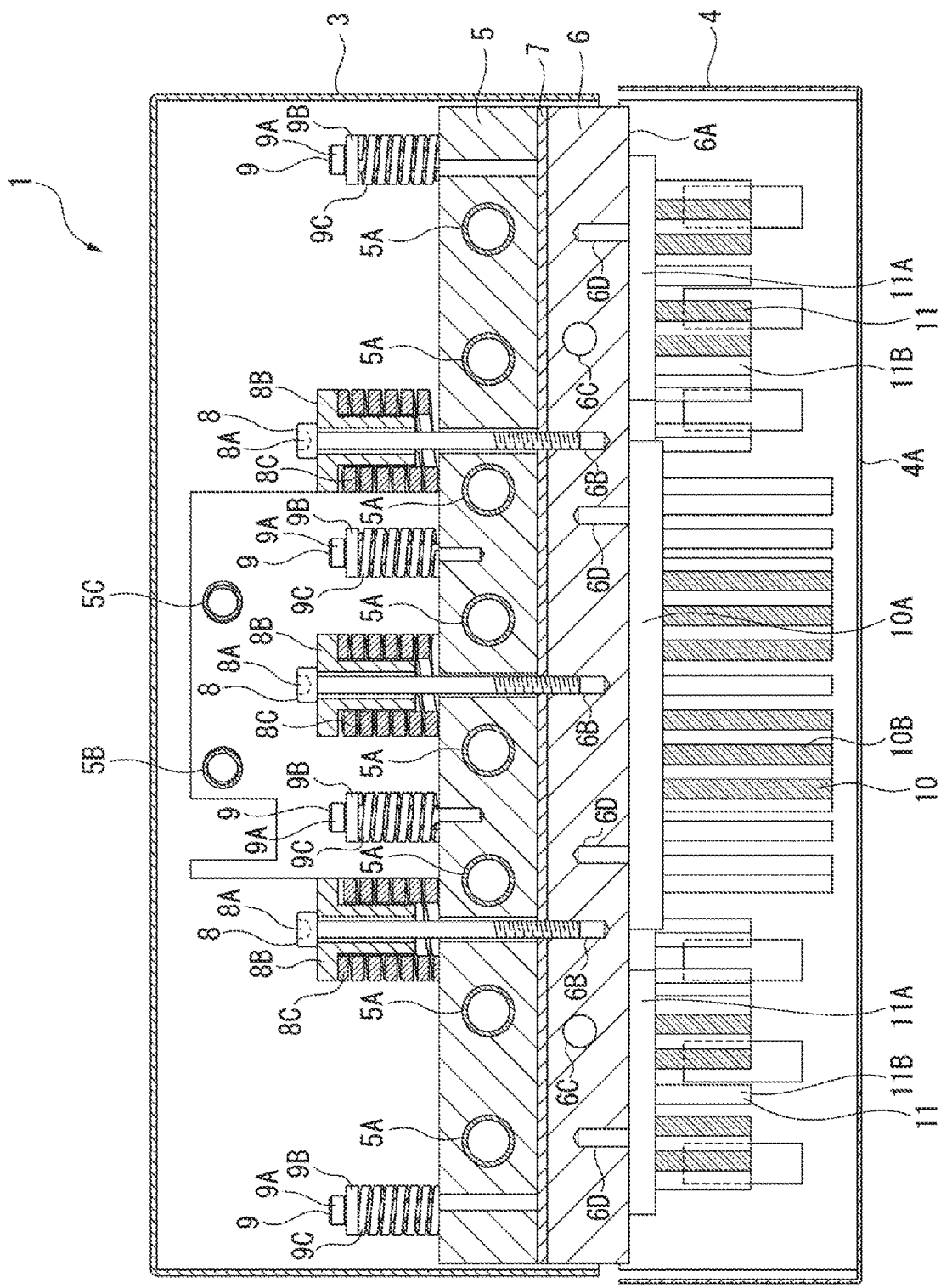
FIG. 4 is a cross-sectional view showing the structure of the thermoelectric generator according to the first exemplary embodiment.

FIGS. 2 to 4 show a structure of the thermoelectric generator 1. FIG. 2 is a perspective view as viewed from above, FIG. 3 is a perspective view as viewed from below, and FIG. 4 is a cross sectional view.

The thermoelectric generator 1 includes a thermoelectric generator body 2, an upper cover 3, and a lower cover 4. The upper cover 3 of the thermoelectric generator 1 keeps the flame and the combustion gas discharged from the exhaust outlet 101 from reaching an upper part of the thermoelectric generator body 2. The lower cover 4 of the thermoelectric generator 1 guides the flame and the high-temperature combustion gas from the exhaust outlet 101 toward the thermoelectric generator body 2.

2-1. Structure of Thermoelectric Generator Body 2

The thermoelectric generator body 2 includes a cooling plate 5, a heat-receiving plate 6, and a thermoelectric generation module 7.

The cooling plate 5, which is a cooler configured to cool the thermoelectric generation module 7, is made of an aluminum rectangular thick plate, for instance.

As shown in FIG. 4, a cooling circuit 5A for circulating a coolant is provided inside the cooling plate 5. The temperature of the entirety of the cooling plate 5 is kept approximately in a range from 20 degrees C. to 40 degrees C. by the cooling water circulating in the cooling circuit 5A. A feed pipe 5B and a return pipe 5C for the coolant are connected to the cooling circuit 5A. The coolant supplied through the feed pipe 5B flows through the cooling circuit 5A to cool the cooling plate 5, and then is discharged through the return pipe 5C.

As shown in FIG. 4, the heat-receiving plate 6, which is a heater configured to heat the thermoelectric generation module 7, is provided with a heat-receiving surface 6A for absorbing thermal energy of the flame from the exhaust outlet 101 and is made of an aluminum rectangular thick plate, for instance.

A plurality of female screw holes 6B are formed on a surface of the heat-receiving plate 6 opposite the heat-receiving surface 6A. Two heat pipes 6C are provided in the heat-receiving plate 6. A plurality of female screw holes 6D are formed in the heat-receiving surface 6A.

The heat pipes 6C serve as an isothermalizer configured to isothermalize the heat-receiving plate 6 receiving the heat (i.e. equalize the heat distribution) received by the heat-receiving surface 6A. Specifically, the heat pipes 6C are each a metallic pipe with a capillary structure on an inner wall thereof, the pressure inside the metallic pipe being set at negative pressure. A little amount of water as a working fluid is sealed within the metallic pipe. When thermal energy is absorbed by latent heat of the evaporating working fluid, the evaporated working fluid moves to a low-temperature part, at which the working fluid touches a pipe wall to release the heat by the latent heat of the condensed working fluid. The above cycle is repeated to transfer the thermal energy efficiently.

Figure 5:
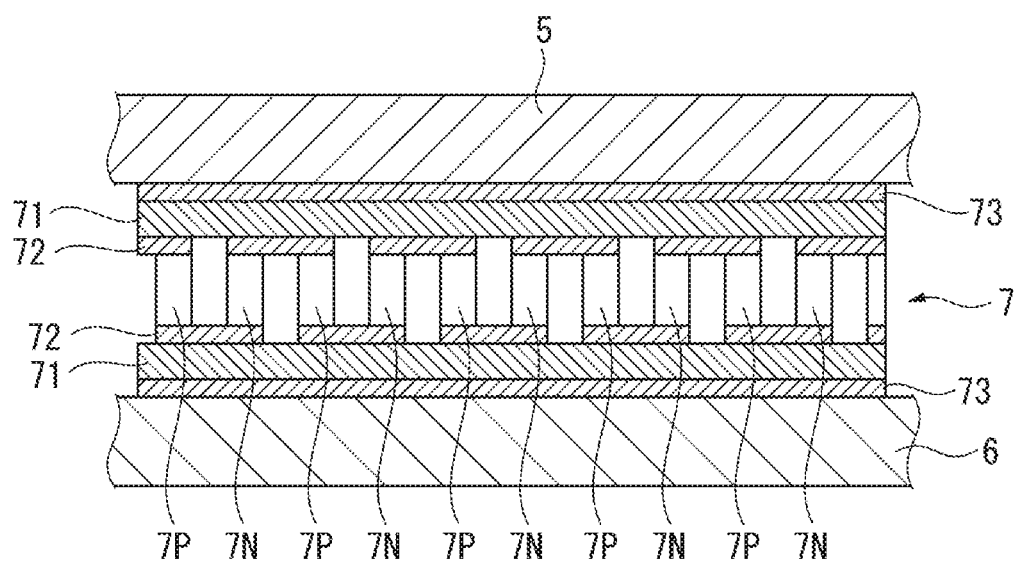
FIG. 5 is a cross-sectional view showing a structure of a thermoelectric generation module of the thermoelectric generator according to the first exemplary embodiment.

As shown in FIG. 5, the thermoelectric generation module 7 includes substrates 71, electrodes 72, and thermoelectric elements 7P, 7N.

The substrates 71, which are each made of a ceramic or polyimide film, includes a pair of high-temperature and low-temperature substrates that face each other.

The electrodes 72, which are made of a metallic material such as copper, are provided on respective facing surfaces of the substrates 71.

The thermoelectric elements 7P, 7N are interposed between facing electrodes 72, where the P-type thermoelectric elements 7P and N-type thermoelectric elements 7N are alternately arranged.

End faces of the P-type thermoelectric elements 7P and N-type thermoelectric elements 7N are solder-jointed to the electrodes 72, so that the thermoelectric generation module 7 defines a circuit in which the P-type thermoelectric elements 7P and the N-type thermoelectric elements 7N are alternately connected in series.

A carbon sheet 73 is interposed between the heat-receiving plate 6 and the substrate 71 of the thermoelectric generation module 7. The carbon sheet 73 is also interposed between the cooling plate 5 and the substrate 71. The carbon sheet 73 serve as a heat transfer layer for transferring the heat transferred from the heat-receiving plate 6 to the substrate 71 and transferring the heat of the upper one of the substrates 71 to the cooling plate 5.

The cooling plate 5, the heat-receiving plate 6, the thermoelectric generation module 7, and the carbon sheets 73 in the above arrangement are integrated using five first fasteners 8 and eight second fasteners 9.

As shown in FIG. 4, each of the first fasteners 8 includes a bolt 8A, a receiver 8B, and a coil spring 8C. The bolt 8A is inserted through the cooling plate 5, the thermoelectric generation module 7, and the carbon sheets 73 to be screwed into corresponding one of the female screw holes 6B of the heat-receiving plate 6.

Each of the receivers 8B, which is a metallic cylindrical component receiving corresponding one of the bolts 8A, includes a flange at an end thereof.

When the bolts 8A are screwed into the corresponding female screw holes 6B of the heat-receiving plate 6, each of the coil springs 8C, which receives an outer circumferential portion of corresponding one of the receivers 8B, is compressed by the flange of the receiver 8B in an insertion direction to bias the cooling plate 5 toward the heat-receiving plate 6.

The second fasteners 9, which are components for fastening the heat-receiving plate 6 and the cooling plate 5 at outer peripheral ends thereof, are configured to be substantially the same as the first fasteners 8 and each include a bolt 9A, a receiver 9B, and a coil spring 9C.

2-2. Structures of Upper Cover 3 and Lower Cover 4

The upper cover 3, which is configured to prevent the flame and combustion gas discharged from below-described heat outlets 4B of the lower cover 4 from reaching the components provided on an upper surface of the cooling plate 5, is a metallic box covering the cooling plate 5. An opening 3A for installation of the feed pipe 5B and the return pipe 5C of the coolant is provided in a side surface of the upper cover 3.

The lower cover 4, which is configured to guide the flame and high-temperature combustion gas blown out of the exhaust outlet 101 toward the heat-receiving surface 6A of the heat-receiving plate 6, is a metallic box covering the heat-receiving surface 6A of the heat-receiving plate 6. A single circular heat inlet 4A is provided at a bottom side of the box of the lower cover 4. A plurality of rectangular heat outlets 4B are provided on side surfaces of the box of the lower cover 4.

The heat inlet 4A, which is configured to guide the flame and the high-temperature combustion gas from the exhaust outlet 101 substantially toward the center of the heat-receiving plate 6, is defined at a position substantially corresponding to the center of the heat-receiving plate 6. It should be noted that the heat inlet 4A, which is a single circular hole corresponding to the shape of the flame from the exhaust outlet 101 in the first exemplary embodiment, is not necessary circular but may be rectangular, and may include a plurality of holes.

The heat outlets 4B are formed in order to discharge the combustion gas whose temperature is reduced after the flame and the high-temperature combustion gas introduced through the heat inlet 4A heat the heat-receiving plate 6. The heat outlets 4B are a plurality of vertically elongated rectangular holes provided on each of four side walls of the lower cover 4. It should be noted that the heat outlets 4B, which are configured as the vertically elongated holes in the first exemplary embodiment, are not necessarily vertically elongated holes but may be a plurality of horizontally elongated rectangular holes or oval holes.

An opening area of the heat inlet 4A is larger than a total opening areas of the plurality of heat outlets 4B. The large opening area of the heat inlet 4A keeps an inner pressure of the lower cover 4 to be higher than an outside pressure of the lower cover 4 after the flame and the high-temperature combustion gas are introduced through the heat inlet 4A, thereby keeping low-temperature external air from entering the inside of the lower cover 4. Further, the lower cover 4, which defines a wall against the external air, holds the high-temperature combustion gas inside the lower cover 4, keeping the high-temperature conditions for a long time.

2-3. Structures of Heat Diffuser 10 and Heat Absorbers 11

As shown in FIGS. 3 and 4, the above-described heat-receiving surface 6A of the heat-receiving plate 6 is provided with a heat diffuser 10 and heat absorbers 11.

The heat diffuser 10 is configured to absorb the thermal energy of the flame and the high-temperature combustion gas introduced through the heat inlet 4A of the lower cover 4 and diffuse the combustion gas to an outer periphery of the heat-receiving plate 6. The heat diffuser 10 is provided on the on the heat-receiving surface 6A of the heat-receiving plate 6 at a position corresponding to the heat inlet 4A of the lower cover 4. In the first exemplary embodiment, the heat inlet 4A is located approximately at the center of the heat-receiving surface 6A. Accordingly, the heat diffuser 10 is disposed approximately at the center of the heat-receiving surface 6A.

Figure 6:
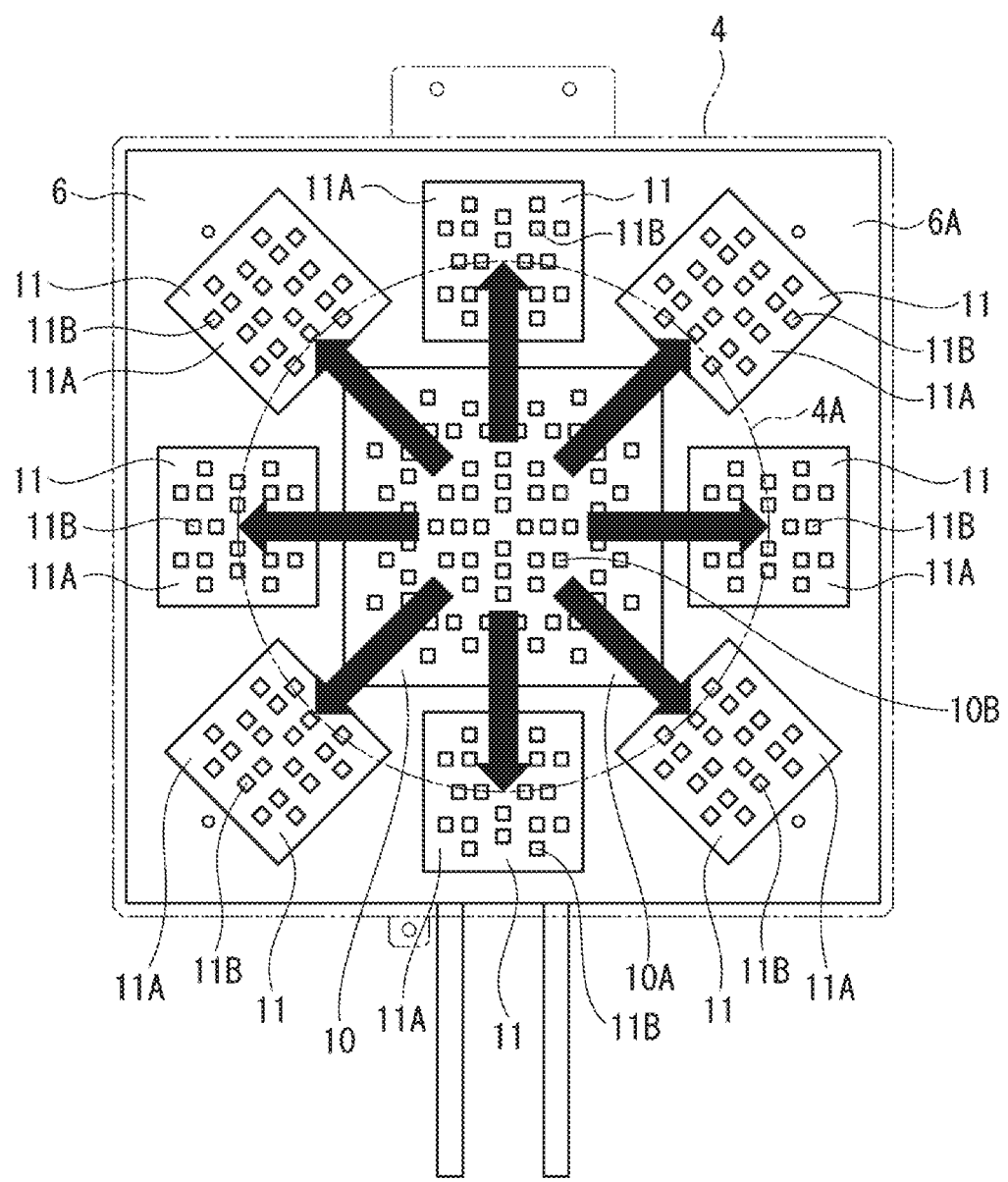
FIG. 6 is a bottom plan view showing the structure of the thermoelectric generator according to the first exemplary embodiment.
Figure 7:
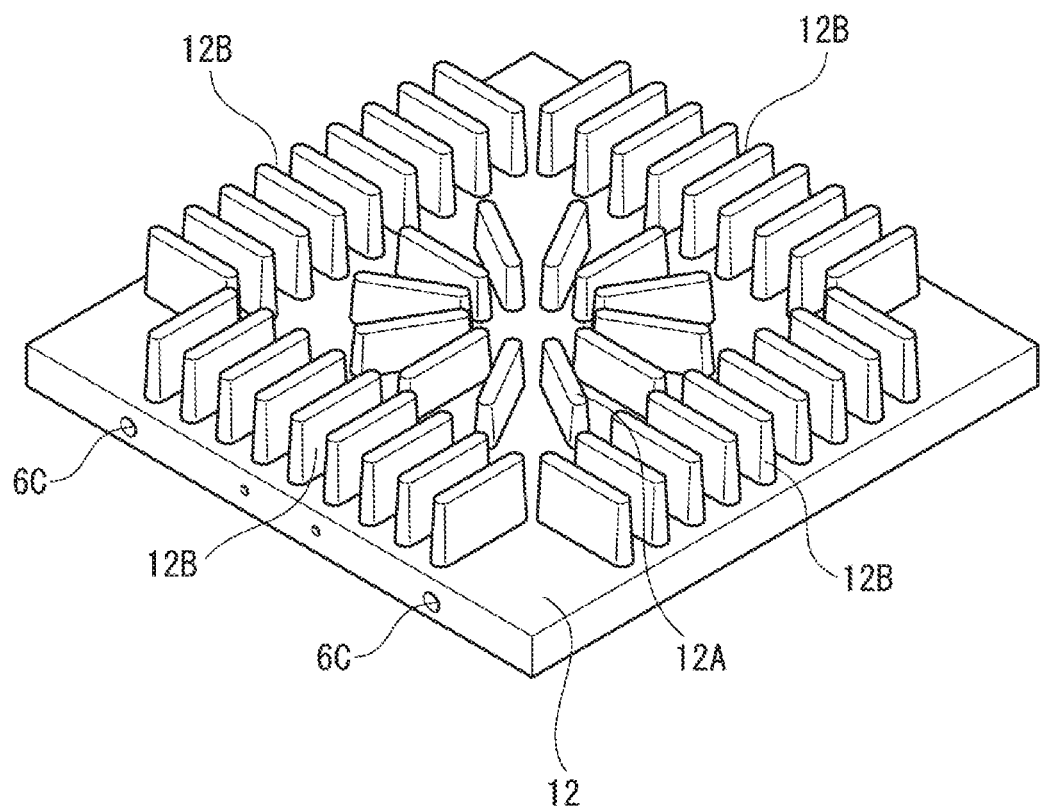
FIG. 7 is a perspective view showing a structure of a heat-receiving plate of a thermoelectric generator according to a second exemplary embodiment of the invention.

As shown in FIGS. 4 and 6, the heat diffuser 10 includes a base 10A and diffuser units 10B.

The base 10A, which is a rectangular plate made of a metal with excellent thermal conductivity (e.g. aluminum), is in close contact with the heat-receiving surface 6A of the heat-receiving plate 6 via a thermally conductive adhesive. The base 10A is fixed on the heat-receiving surface 6A through bolts bolted into the female screw holes 6D formed on the heat-receiving surface 6A.

The diffuser units 10B, which are a plurality of metallic pillars projecting upright in an out-of-plane direction of the base 10A, are integrated with the base 10A. The diffuser units 10B diffuse the combustion gas introduced through the heat inlet 4A toward the outer periphery of the heat-receiving plate 6. Further, the diffuser units 10B, while being heated by the flame, also serve as a heat absorber for absorbing the thermal energy of the combustion gas.

As shown in FIGS. 4 and 6, the heat absorbers 11 are provided on the heat-receiving surface 6A to surround the heat diffuser 10. In the first exemplary embodiment, eight heat absorbers 11 are provided around the heat diffuser 10.

The heat absorbers 11, which are configured to absorb the thermal energy of the combustion gas diffused by the heat diffuser 10, each include a base 11A and absorber units 11B.

The base 11A, which is a rectangular plate made of a metal with excellent thermal conductivity (e.g. aluminum) in the same manner as the heat diffuser 10, is in close contact with the heat-receiving surface 6A of the heat-receiving plate 6 via a thermally conductive adhesive. The base 11A is fixed on the heat-receiving surface 6A through bolts bolted into the female screw holes 6D formed on the heat-receiving surface 6A.

The absorber units 11B, which are a plurality of metallic pillars projecting upright in an out-of-plane direction of the base 11A, are integrated with the base 11A. It should be noted that, though the height of the absorber units 11B is smaller than the height of the diffuser units 10B of the heat diffuser 10 in the first exemplary embodiment, the height of the absorber units 11B may be the same as or larger than the height of the diffuser units 10B. The absorber unit 11B is heated by the high-temperature combustion gas diffused by the diffuser units 10B of the heat diffuser 10 to absorb the thermal energy of the combustion gas.

3. Modification(s) of Embodiment(s)

When flame is blown out of the exhaust outlet 101 of the above-described thermoelectric generator 1, the flame and the high-temperature combustion gas are introduced into the heat inlet 4A of the lower cover 4. The introduced flame and high-temperature combustion gas are, while heating the diffuser units 10B of the heat diffuser 10, diffused toward the outer periphery of the heat-receiving plate 6 along the heat-receiving surface 6A as shown by arrows in FIG. 6.

The diffused flame and high-temperature combustion gas heat the absorber units 11B of the heat absorbers 11, and the combustion gas with reduced temperature is discharged to an outside through the heat outlets 4B.

The heat of the heated diffuser units 10B and the absorber units 11B is transferred to the respective bases 10A, 11A, and is transferred to the heat-receiving surface 6A through the thermally conductive adhesive.

The heat transferred to the heat-receiving surface 6A is diffused to the entirety of the heat-receiving plate 6 by the heat pipes 6C, isothermalizing the heat-receiving plate 6.

The thermoelectric generation module 7 generates electricity based on the temperature difference between the isothermalized heat-receiving plate 6 and the cooling plate 5.

According to the first exemplary embodiment, the heat inlet 4A provided in the lower cover 4 allows the flame and high-temperature combustion gas blowing out of the exhaust outlet 101 of the heat-treating furnace 100 to be efficiently introduced to the heat-receiving plate 6. The plurality of heat outlets 4B provided in the lower cover 4 allow the combustion gas, which has heated the heat-receiving plate 6 and thus is reduced in temperature, to be discharged to an outside through the heat outlets 4B and to introduce new flame and high-temperature combustion gas from the heat inlet 4A toward the heat-receiving plate 6.

The heat diffuser 10 can diffuse the thermal energy introduced through the heat inlet 4A along the heat-receiving surface 6A. The heat absorbers 11, which are disposed to surround the heat diffuser 10, can efficiently transfer the heat diffused by the heat diffuser 10 to the heat-receiving plate 6.

Accordingly, the heat-receiving plate 6 can be evenly and efficiently heated even when the flame irregularly and unevenly blows out of the exhaust outlet 101 of the heat-treating furnace 100.

The thermal energy is not only absorbed by the heat absorbers 11 but also by the heat diffuser 10 that is adapted to absorb heat, so that the heat-receiving plate 6 can be further evenly heated.

The heat pipes 6C provided in the heat-receiving plate 6 diffuse the heat transferred to a part of the heat-receiving plate 6 to the entirety of the heat-receiving plate 6, thus further evenly heating the heat-receiving plate 6.

4. Second Exemplary Embodiment

Next, a second exemplary embodiment of the invention will be described below. It should be noted that the same parts as already described will be denoted by the same reference characters hereinbelow to omit the description thereof.

In the above-described first exemplary embodiment, the heat diffuser 10 and the heat absorbers 11 are bolted into the female screw holes 6D in the heat-receiving surface 6A of the heat-receiving plate 6.

In contrast, in the second exemplary embodiment, a heat diffuser 12A and heat absorbers 12B in a form of plate-shaped ribs are integrally provided on the heat-receiving plate 12.

The heat diffuser 12A is provided by a plurality of ribs arranged along a circle substantially around the center of the heat-receiving plate 12. Each of the ribs is a metallic plate with excellent thermal conductivity (e.g. aluminum) in the same manner as the heat-receiving plate 12.

The heat absorbers 12B are provided by a plurality of ribs arranged along an outer peripheries of the rectangular profile of the heat-receiving plate 12. Each of the ribs is a metallic plate with excellent thermal conductivity (e.g. aluminum) in the same manner as the heat-receiving plate 12.

Two heat pipes 6C are provided in the heat-receiving plate 12 as in the first exemplary embodiment.

The heat-receiving plate 12, heat diffuser 12A, and heat absorber 12B are produced through die-casting.

In the second exemplary embodiment, the flame and the high-temperature combustion gas are introduced to the heat diffuser 12A located at a position corresponding to the heat inlet 4A, whereby the thermal energy heats the heat diffuser 12A while being diffused toward an outer periphery along the ribs of the heat diffuser 12A.

After the heat of the diffused high-temperature combustion gas is absorbed by the heat absorbers 12B, the combustion gas is discharged through the heat outlets 4B to an outside.

The same effects and advantages as those in the above-described first exemplary embodiment can be achieved by the second exemplary embodiment.

5. Third Exemplary Embodiment

Next, a third exemplary embodiment of the invention will be described below.

In the above-described second exemplary embodiment, the heat diffuser 12A and the heat absorber 12B are provided by a plurality of ribs integrated with the heat-receiving plate 12.

Figure 8:
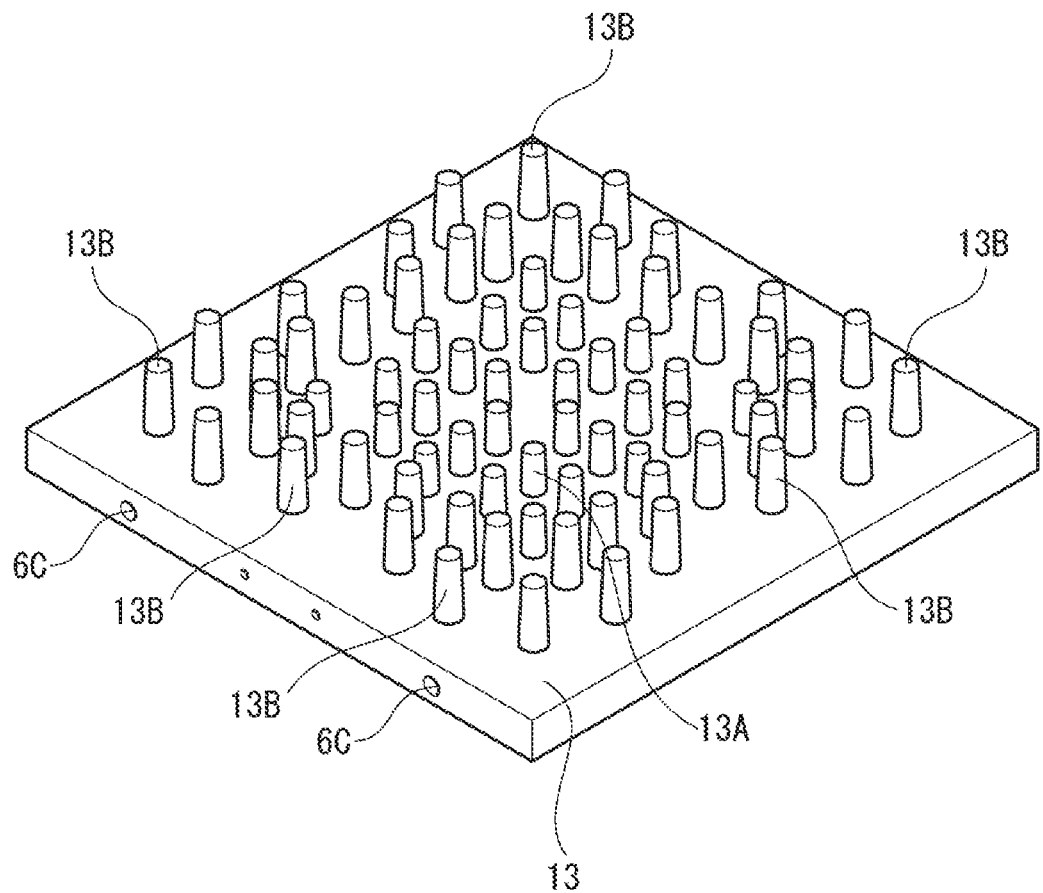
FIG. 8 is a perspective view showing a structure of a heat-receiving plate of a thermoelectric generator according to a third exemplary embodiment of the invention.

In contrast, a heat diffuser 13A and heat absorbers 13B in the third exemplary embodiment are provided by a plurality of pillars integrated with a heat-receiving plate 13 as shown in FIG. 8.

The heat diffuser 13A, which is located at a position corresponding to the heat inlet 4A substantially at the center of the heat-receiving plate 13, is provided by a plurality of pillars standing upright on the heat-receiving plate 13. Each of the pillars is made of a metallic material with excellent thermal conductivity (e.g. aluminum).

The heat absorbers 13B, which surround the heat diffuser 13A, are provided by a plurality of pillars standing upright on the heat-receiving plate 13. Unlike the first exemplary embodiment, the height of each of the heat absorbers 13B is larger than the height of the pillars of the heat diffuser 13A.

The third exemplary embodiment offers the effects as described in the first exemplary embodiment. In addition, since the surface area of the heat absorbers 13B is enlarged, the absorption of the thermal energy by the heat absorbers 13B can be enhanced, so that the heat-receiving plate 13 can be further evenly heated.

6. Modification(s) of Embodiment(s)

It should be noted that the scope of the invention is not limited to the above-described exemplary embodiments, but encompasses modification(s) and improvement(s) as long as such modification(s) and improvement(s) are compatible with an object of the invention.

For instance, though the thermoelectric generator 1 according to the above exemplary embodiments is incorporated in the heat-treating furnace 100, the thermoelectric generator 1 is not necessarily incorporated in the heat-treating furnace 100 but is applicable to other flame-jetting heat sources.

The heat diffusers 10, 12A, 13A and the heat absorbers 11, 12B, 13B in the exemplary embodiments, which project from the heat-receiving surfaces of the heat-receiving plates 6, 12, 13, respectively, are not necessarily configured as in the above in the invention. For instance, a heat diffuser and heat absorber in a form of grooves are provided on the heat-receiving surface of corresponding one of the heat-receiving plates 6, 12, 13 in some embodiments to diffuse and absorb the heat introduced through the heat inlet 4A.

In addition, the structure, shape and the like of the invention may be altered in any manner as long as an object of the invention is achievable.

The invention claimed is:

1. A thermoelectric generator comprising;
   a heat-receiving plate comprising a heat-receiving surface that is configured to receive flame and combustion gas;
   a thermoelectric generation module provided at a surface of the heat-receiving plate opposite the heat-receiving surface;
   a cooling plate disposed at a side of the thermoelectric generation module opposite a side where the heat-receiving plate is disposed;
   a cover covering the heat-receiving surface, the cover comprising a heat inlet that introduces the flame and the combustion gas and a heat outlet that discharges the combustion gas introduced through the heat inlet, a temperature of the combustion gas at the heat outlet being less than a temperature of the combustion gas at the heat inlet;
   a heat diffuser disposed on the heat-receiving surface at a position corresponding to the heat inlet, the heat diffuser being configured to diffuse the combustion gas introduced through the heat inlet along the heat-receiving surface; and
   a heat absorber disposed on the heat-receiving surface to surround the heat diffuser, the heat absorber being configured to absorb heat of the combustion gas that is diffused by the heat diffuser,
   wherein the heat diffuser comprises a plate-shaped base that is fixed on the heat-receiving surface and a pillar-shaped diffuser that projects upright in a direction orthogonal to a surface of the plate-shaped base of the heat diffuser, and
   wherein the heat absorber is disposed to surround the heat diffuser, the heat absorber comprising:
      a plurality of plate-shaped bases that are fixed on the heat-receiving surface, and
      a pillar-shaped heat absorber that projects upright in a direction orthogonal to a surface of one of the plurality of plate-shaped bases of the heat absorber.

2. The thermoelectric generator according to claim 1, wherein the heat diffuser is configured to absorb a portion of heat of the flame and the combustion gas that are introduced through the heat inlet.

3. The thermoelectric generator according to claim 1, wherein the heat-receiving plate is provided with an isothermalizer that isothermalizes the heat-receiving plate receiving the heat on the heat-receiving surface.

4. The thermoelectric generator according to claim 1, wherein an opening area of the heat inlet is larger than an opening area of the heat outlet.

5. The thermoelectric generator according to claim 1, wherein each of the pillar-shaped diffuser and the pillar-shaped heat absorber is orthogonal to the heat-receiving surface.

6. The thermoelectric generator according to claim 1, wherein each of the surface of the plate-shaped base of the heat diffuser and the surface of the one of the plurality of plate-shaped bases of the heat absorber is parallel to the heat-receiving surface.

7. The thermoelectric generator according to claim 1, wherein a length of the pillar-shaped diffuser is greater than a length of the pillar-shaped heat absorber.

8. The thermoelectric generator according to claim 2, wherein the heat of the combustion gas diffused by the heat diffuser is another portion of the heat of the flame and the combustion gas that are introduced through the heat inlet.

9. The thermoelectric generator according to claim 1, wherein the heat diffuser further comprises a plurality of pillar-shaped diffusers that project upright in the direction orthogonal to the surface of the plate-shaped base of the heat diffuser, the pillar-shaped diffuser being one of the plurality of pillar-shaped diffusers.

10. The thermoelectric generator according to claim 1, wherein the plate-shaped base of the heat diffuser faces the heat inlet, and the pillar-shaped diffuser extends toward the heat inlet.

11. The thermoelectric generator according to claim 1, wherein an outer perimeter of the plate-shaped base of the heat diffuser is disposed within a circumference of the heat inlet.

12. The thermoelectric generator according to claim 1, wherein each of the plurality of plate-shaped bases of the heat absorber has a portion disposed within a circumference of the heat inlet and another portion disposed outside the circumference of the heat inlet.

13. The thermoelectric generator according to claim 12, wherein an outer perimeter of the plate-shaped base of the heat diffuser is disposed within the circumference of the heat inlet.

* * * * *